(12) United States Patent
Mori et al.

(10) Patent No.: US 7,813,398 B2
(45) Date of Patent: Oct. 12, 2010

(54) SEMICONDUCTOR OPTICAL ELEMENT FOR EXTERNAL CAVITY LASER

(75) Inventors: Hiroshi Mori, Kawasaki (JP); Atsushi Yamada, Atsugi (JP); Takahiro Samejima, Ebina (JP)

(73) Assignee: Anritsu Corporation, Atsugi-shi (JP)

( * ) Notice: Subject to any disclaimer, the term of this patent is extended or adjusted under 35 U.S.C. 154(b) by 214 days.

(21) Appl. No.: 12/067,601

(22) PCT Filed: Sep. 27, 2006

(86) PCT No.: PCT/JP2006/319121
§ 371 (c)(1),
(2), (4) Date: Mar. 20, 2008

(87) PCT Pub. No.: WO2007/040108
PCT Pub. Date: Apr. 12, 2007

(65) Prior Publication Data
US 2009/0225801 A1 Sep. 10, 2009

(30) Foreign Application Priority Data
Sep. 30, 2005 (JP) ............................. 2005-287726

(51) Int. Cl.
*H01S 5/00* (2006.01)
(52) U.S. Cl. .................. 372/45.01; 372/99; 372/102
(58) Field of Classification Search ............. 372/45.01; 359/344
See application file for complete search history.

(56) References Cited
U.S. PATENT DOCUMENTS
| | | | |
|---|---|---|---|
| 4,965,525 A | 10/1990 | Zah | |
| 6,008,675 A | 12/1999 | Handa | |
| 6,091,755 A | 7/2000 | Sanders et al. | |
| 6,118,803 A * | 9/2000 | Sanders et al. | 372/50.22 |
| 7,203,409 B2 * | 4/2007 | Merritt et al. | 385/129 |

(Continued)

FOREIGN PATENT DOCUMENTS

JP A 5-27130 2/1993

(Continued)

*Primary Examiner*—Minsun Harvey
*Assistant Examiner*—Xnning Niu
(74) *Attorney, Agent, or Firm*—Greer, Burns & Crain, Ltd.

(57) ABSTRACT

The present invention provides a semiconductor optical element applicable to an EC-LD or an SLD, and an external cavity laser having the semiconductor optical element. The semiconductor optical element has a pair of cleavage surfaces, and comprises a semiconductor substrate 11 having a base surface and a planer structure provided on the base surface and provided with a waveguide 1G having an active layer. The waveguide 1G has an end surface with low reflectivity and another end surface with certain reflectivity. The waveguide 1G includes an end portion having a first optical axis in the vicinity of the first end surface $1T_L$ and an end portion having a second optical axis in the vicinity of the second end surface $1T_H$, the first optical axis being inclined at a first angle $\Phi_L$ other than zero degree with respect to a normal to the first end surface $1T_L$, the second optical axis being inclined at a second angle $\Phi_H$ other than zero degree with respect to a normal to the second end surface $1T_H$, the first angle $\Phi_L$ being different from the second angle $\Phi_H$. The end portion of the waveguide 1G is different in width from the other end portion of the waveguide 1G.

6 Claims, 12 Drawing Sheets

U.S. PATENT DOCUMENTS

2003/0099440 A1  5/2003  Kim

FOREIGN PATENT DOCUMENTS

| | | | |
|---|---|---|---|
| JP | A | 5-501938 | 4/1993 |
| JP | A | 10-51076 | 2/1998 |
| JP | A | 2000-35522 | 2/2000 |
| JP | A | 2003-167176 | 6/2003 |
| JP | A | 2004-266095 | 9/2004 |

* cited by examiner

US 7,813,398 B2

SEMICONDUCTOR OPTICAL ELEMENT FOR EXTERNAL CAVITY LASER

TECHNICAL FIELD OF THE INVENTION

The present invention relates to a semiconductor optical element for an external cavity laser.

BACKGROUND OF THE INVENTION

Up until now, there have been proposed a wide variety of semiconductor optical elements of this type, one typical example of which needs to include a waveguide having one end surface with low reflectivity and one end surface with high reflectivity. Each of the semiconductor optical elements is to be applied to an optical device such as an external cavity laser diode (EC-LD) and a superluminescent diode (SLD).

To reduce the reflectivity of the end surface of the waveguide, the following waveguides have been proposed: a waveguide having a window structure at the end surface thereof; and a waveguide including an end portion having an optical axis, which is not perpendicular to the end surface thereof.

The waveguide provided with the window structure, however, may have a crystal defect in the vicinity of the window structure. The occurrence of the crystal defect may reduce reliability of a semiconductor optical element having the waveguide.

To avoid the above problem, there has been proposed a semiconductor optical element including a waveguide having an optical axis, which is not perpendicular to an end surface of the semiconductor optical element (refer to, for example, Patent Documents 1 and 2).

FIG. 13(a) is a top view of a semiconductor optical amplifier (SOA) 110, which is one of semiconductor elements disclosed in Patent Document 1. The semiconductor optical amplifier 110 includes a linear waveguide 110G having an optical axis, which is not perpendicular to a cleavage surface $110G_1$ and a cleavage surface $110G_2$ of the semiconductor optical amplifier 110. Patent Document 1 also discloses that reflectivity of a traveling-wave laser amplifier is reduced by flaring a waveguiding portion of the amplifier in the immediate vicinities of the end surfaces of the waveguide 110G.

FIG. 13(b) is a top view of an optical device 130 having an EC-LD 120, which is one of semiconductor elements disclosed in Patent Document 2. The EC-LD 120 has cleavage surfaces $120G_1$ and $120G_2$ and includes a waveguide 120G having an end surface low reflectivity and an end surface with high reflectivity. The low-reflectivity end surface of the waveguide 120G is inclined at a predetermined angle with respect to the cleavage surface $120G_1$, while the high-reflectivity end surface of the waveguide 120G is perpendicular to the cleavage surface $120G_2$.

In the optical device 130, light is generated in the waveguide 120G, reflected on the high-reflectivity end surface of the waveguide 120G, and returned to the inside of the waveguide 120G. The light then reaches a diffraction grating 122 through a collimator lens 121.

Among the light diffracted by the diffraction grating 122, only light having a wavelength satisfying a predetermined condition is reflected on a recursive mirror 123, diffracted by the diffraction grating 122 again, and returned to the EC-LD 120. The optical device 130 is designed to select a frequency of laser oscillation. The light is output from the optical device 130 to the side opposite to the EC-LD 120 through diffraction on the face of the diffraction grating 122.

Patent Document 1: U.S. Pat. No. 4,965,525 (pages 2 to 5, FIG. 1)

Patent Document 2: U.S. Pat. No. 6,091,755 (page 5, FIG. 2)

DISCLOSURE OF THE INVENTION

Problems to be Solved by the Invention

The conventional semiconductor element disclosed in Patent Document 1 is designed for a semiconductor optical amplifier (SOA) having a waveguide with low-reflectivity end surfaces. The semiconductor element disclosed in Patent Document 1 cannot be thus applied to an EC-LD, which requires certain reflectivity at one end surface thereof.

The conventional semiconductor element disclosed in Patent Document 2 includes a waveguide having an end surface with low reflectivity and another end surface with high reflectivity, the end surface with low reflectivity being not perpendicular to a cleavage surface of the EC-LD, the end surface with high reflectivity being perpendicular to a normal to another cleavage surface of the EC-LD. The semiconductor element disclosed in Patent Document 2 can be applied to an EC-LD and SLD. The end surface with high reflectivity has reflectivity of 30% or more without being coated. This reflectivity is excessively high for the semiconductor element disclosed in Patent Document 2, which is to be applied to an EC-LD or SLD. As described above, it is necessary that the light be output from the side of the diffraction grating, or that the end surface of the waveguide be coated by an antireflection film to reduce the reflectivity, which prevents a large amount of light from being output, or which makes the manufacturing process complicated.

The conventional semiconductor optical element disclosed in Patent Document 2 includes a waveguide having an end surface inclined with respect to the surface of the laser and another end surface perpendicular to a normal to the other surface of the laser. This makes it difficult to downsize an optical device having the conventional semiconductor optical element, or makes the assembly of the optical device complicated.

It is, therefore, an object of the present invention to provide a semiconductor optical element for an external cavity laser which has an end surface with low reflectivity and another end surface with certain reflectivity and includes a waveguide, each of the end surfaces being not perpendicular to an optical axis of a corresponding one of end portions of the waveguide.

Means for Solving the Invention

The semiconductor optical element for an external cavity laser according to an aspect of the present invention has a pair of cleavage surfaces, and comprises: a semiconductor substrate having a base surface; and a planer structure provided on the base surface and provided with a waveguide having an active layer; wherein the waveguide has first and second end surfaces defined by the respective cleavage surfaces, the first end surface of the waveguide has first reflectivity, the second end surface has second reflectivity, the waveguide includes one end portion having an optical axis being at a first angle to a normal to the first end surface, and one end portion having an optical axis being at a second angle to a normal to the second end surface, the waveguide guides light so that the light is output from the first end surface in a first direction, and that the light is output from the second end surface in a second direction parallel to the first direction, and the light guided by the waveguide in the vicinity of the first end surface has a first spot size measured in a lateral direction of the waveguide, and the light guided by the waveguide in the vicinity of the second end surface has a second spot size measured in the lateral direction of the waveguide, the first spot size being different from the second spot size so that said first reflectivity is different from said second reflectivity.

In the semiconductor optical element thus constructed, the direction of propagation of the light output from the first end surface is parallel to that of propagation of the light output from the second end surface under the condition that the first reflectivity is different from the second reflectivity.

The semiconductor optical element for an external cavity laser according to another aspect of the present invention having a pair of cleavage surfaces parallel to each other, and comprises: a semiconductor substrate having a base surface; and a planar structure provided on the base surface and provided with a waveguide having an active layer, wherein the waveguide has first and second surfaces defined by the respective cleavage surfaces, the waveguide includes one end portion having an optical axis being at a first angle to a normal to the first end surface, and one end portion having an optical axis being at a second angle to a normal to the second end surface, the first angle being not equal to zero, the second angle being not equal to zero and different from the first angle, the waveguide guides light so that the light is output from the first end surface in a first direction, and that the light is output from the second end surface in a second direction parallel to the first direction, and the light guided by the waveguide in the vicinity of the first end surface has a first spot size measured in a lateral direction of the waveguide, and the light guided by the waveguide in the vicinity of the second end surface has a second spot size measured in the lateral direction of the waveguide, the first spot size being different from the second spot size so that reflectivity of said first end surface is different from reflectivity of said second end surface.

In the semiconductor optical element thus constructed, the direction of propagation of the light output from the first end surface is parallel to that of propagation of the light output from the second end surface under the condition that the first reflectivity is different from the second reflectivity.

The semiconductor optical element for an external cavity laser according to still another aspect of the present invention having a pair of cleavage surfaces, and comprises a semiconductor substrate having a base surface; and a planer structure provided on the base surface and provided with a waveguide having an active layer, wherein the waveguide has first and second end surfaces defined by the respective cleavage surfaces, the waveguide includes one end portion having an optical axis being at a first angle to a normal to the first end surface, and one end portion having an optical axis being at a second angle to a normal to the second end surface, the first angle being not equal to zero, the second angle being not equal to zero and different from the first angle, the waveguide guides light so that the light in the vicinity of the first end surface has a first spot size measured in a lateral direction of the waveguide, and the light in the vicinity of the second end surface has a second spot size measured in the lateral direction of the waveguide, the first spot size being different from the second spot size so that reflectivity of said first end surface is different from reflectivity of said second end surface.

In the semiconductor optical element thus constructed, the first end surface has reflectivity different from that of the second end surface.

The semiconductor optical element according to still another aspect of the present invention may comprise a waveguide having a first width at the first end surface and a second width at the second end surface, the first width being larger than the second width.

The semiconductor optical element according to still another aspect of the present invention comprises a waveguide having first and second linear portions, the first linear portion having a first width and extending a predetermined distance from the first end surface, the second portion having a second width and extending a predetermined distance from the second end surface.

The semiconductor optical element thus constructed is capable of preventing a variation in the angle of the optical axis of each of the end portion of the waveguide with respect to the normal to a corresponding one of the first and second end surfaces of the waveguide, and a variation in the reflectivity of each of the end surfaces of the waveguide even if either one of or both the first and second end surfaces of the waveguide is or are misaligned from a desired position(s) on the corresponding cleavage surface(s).

The external cavity laser according to the present invention comprises a semiconductor optical element as set forth in any one of claims 1 to 5, and light feedback means for causing light having a specified wavelength, which is output from the first end surface of the waveguide, to selectively return to the first end surface among light output from the first end surface of the waveguide, the light having the specified wavelength being output from the second end surface of the waveguide.

The external cavity laser thus constructed allows an optical system to be simply designed and easily assembled, and allows the optical device to be downsized and a large amount of light to be output.

The present invention provides a semiconductor optical element for an external cavity laser provided with the waveguide, which has an end surface with low reflectivity and another end surface with certain reflectivity, each of the end surfaces being not perpendicular to an optical axis of a corresponding one of the end portions of the waveguide.

BRIEF DESCRIPTION OF THE DRAWINGS

FIGS. 1($b$) and 1($c$) are each a cross-sectional view of the semiconductor optical element according to the first embodiment.

DESCRIPTION OF REFERENCE NUMERALS

Figure 1A:
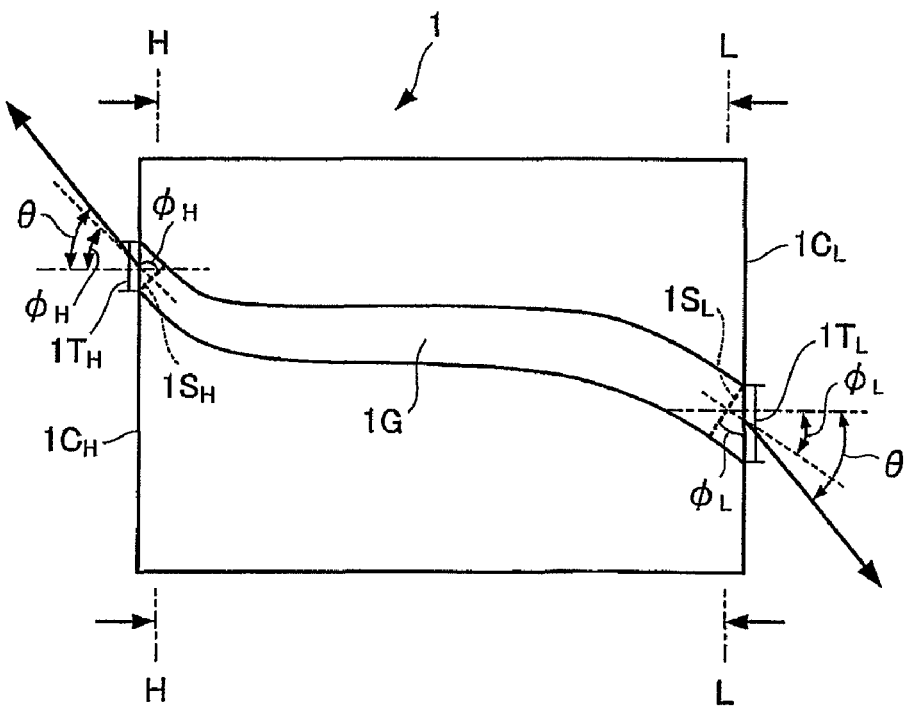
FIG. 1($a$) is a top view of a semiconductor optical element according to the first embodiment of the present invention.

1: Semiconductor optical element
1G: Waveguide
$1T_L$: First end surface
$1T_H$: Second end surface
4: Light feedback means
5: Light output means
11: Semiconductor substrate
13: Active layer
100: External cavity laser

BEST MODE FOR CARRYING OUT THE INVENTION

Embodiments of the semiconductor optical element and the external cavity laser having the semiconductor optical element according to the present invention are described below with reference to the accompanying drawings.

First Embodiment

Figure 1B:
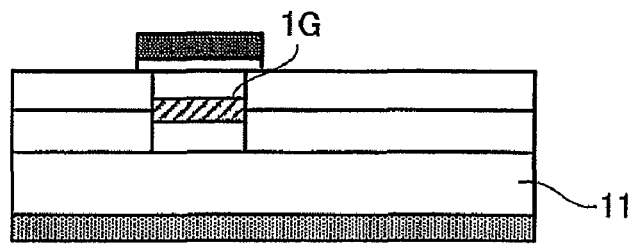
Figure 1C:
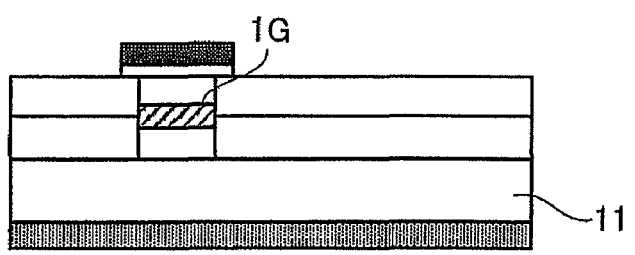

FIG. 1(a) is a top view of a semiconductor optical element 1 according to the first embodiment of the present invention. FIGS. 1(b) and 1(c) are each a cross-sectional view of the semiconductor optical element 1 according to the first embodiment.

As shown in FIG. 1(a), the semiconductor optical element 1 having a pair of cleavage surfaces, and comprises a semiconductor substrate 11 having a base surface, and a planer structure provided on the base surface and provided with a waveguide 1G having an active layer, wherein the waveguide 1G has a first end surface $1T_H$ and a second end surface $1T_H$ which are defined by the cleavage surfaces.

The waveguide includes an opening having a surface defined as the first end surface $1T_L$ in a first cleavage surface $1C_L$ of the semiconductor optical element 1 and an opening having a surface defined as the second end surface $1T_H$ in a second cleavage surface $1C_H$ of the semiconductor optical element 1.

The waveguide 1G includes an end portion having an optical axis in the vicinity of the first end surface $1T_L$ and another end portion having another optical axis in the vicinity of the second end surface $1T_H$. The optical axis in the vicinity of the first end surface $1T_L$ and a normal to the first end surface $1T_L$ form a first angle $\phi_L$ which is not zero degree, while the optical axis in the vicinity of the second end surface $1T_H$ and a normal to the second end surface $1T_H$ form a second angle $\phi_H$ which is not zero degree and is different from the first angle $\phi_L$.

The waveguide 1G is adapted to guide light. The light guided by the waveguide 1G in the vicinity of the first end surface $1T_L$ has a first spot size measured in a lateral direction of the waveguide, while the light guided by the waveguide 1G in the vicinity of the second end surface $1T_H$ has a second spot size measured in the lateral direction of the waveguide, the first and second spot sizes being different from each other.

The direction of propagation of light output from the first end surface $1T_L$ of the waveguide 1G is parallel to the direction of propagation of light output from the second end surface $1T_H$ of the waveguide 1G.

The waveguide has a first waveguide cross section $1S_L$ and a second waveguide cross section $1S_H$. The first waveguide cross section $1S_L$ is taken along a line extending between a point located on the first end surface $1T_L$ of the waveguide and on a first side surface of the waveguide and a point located on a second side surface of the waveguide and on a normal to the first side surface of the waveguide. The first end surface $1T_H$ of the waveguide is at first angle $\phi_L$ to the first waveguide cross section $1S_L$. The second waveguide cross section $1S_H$ is taken along a line extending between a point located on the second end surface $1T_H$ of the waveguide and on the second side surface of the waveguide and a point located on the first side surface of the waveguide and on a normal to the second side surface of the waveguide. The second end surface $1T_L$ of the waveguide is at the second angle $\phi_H$ to the second waveguide cross section $1S_L$.

As shown in FIG. 1(b) illustrating a cross sectional view taken along line L-L of FIG. 1(a) and FIG. 1(c) illustrating a cross sectional view taken along line H-H of FIG. 1(a), the area of the first waveguide cross section $1S_L$ is larger than that of the second waveguide cross section $1S_H$. The first end surface $1T_L$ has first reflectivity $R_L$, and the second end surface $1T_H$ has second reflectivity $R_H$. The first reflectivity $R_L$ is smaller than the second reflectivity $R_H$. The height of the waveguide 1G is constant in general, the height being defined as a distance measured in a direction perpendicular to the base surface of the semiconductor substrate. The width of the waveguide 1G in the first waveguide cross section $1S_L$ is larger than the width of the waveguide 1G in the second waveguide cross section $1S_H$, the widths being defined as distances measured in the lateral direction of the waveguide.

The first reflectivity $R_L$ of the first end surface $1T_L$ defined by the first cleavage surface $1C_L$ needs to be approximately 0.01% so that the semiconductor optical element according to the first embodiment can be applied to an EC-LD or SLD. Coating an antireflection film can reduce the reflectivity to 1/1000 of the reflectivity. The first reflectivity $R_L$ of the first end surface $1T_L$, which is not coated with the antireflection film, is preferably about a tenth of reflectivity of the first end surface $1T_L$ obtained in the case where the first end surface $1T_L$ is perpendicular to the first cleavage surface $1C_L$ and an antireflection film is not provided.

Figure 2:
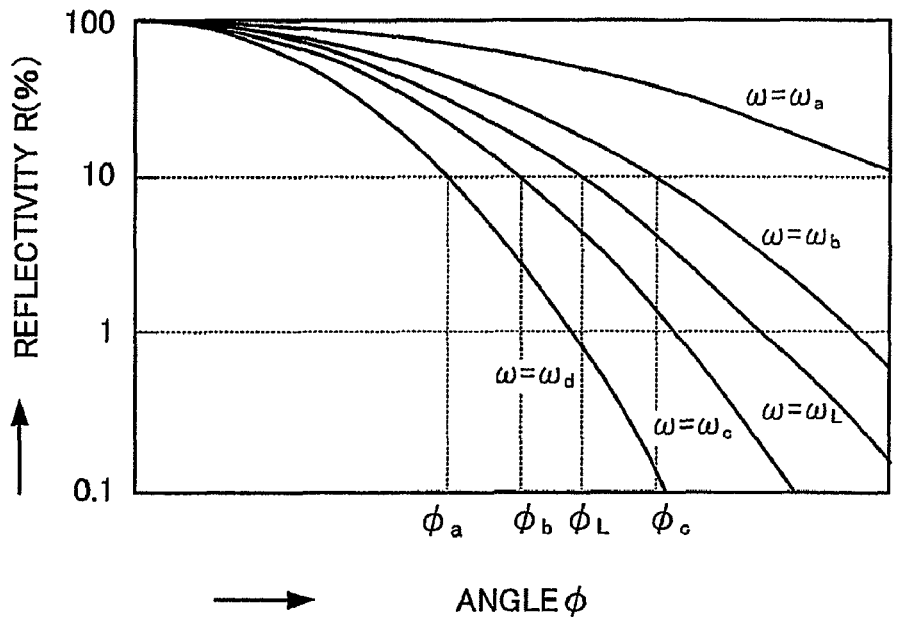
FIG. 2 is a graph showing the relationship between reflectivity R and an angle $\phi$ of an optical axis of an end portion of the waveguide in the vicinity of an end surface of the waveguide with respect to a normal to an end surface of the waveguide.

FIG. 2 is a graph showing the relationship (Equation 1) between the reflectivity R and the angle $\phi$ ($\phi_a<\phi_b<\phi_c<\phi_d$) of the optical axis of the end portion of the waveguide with respect to the normal to the end surface of the waveguide. The spot size $\omega$ ($\omega_a<\omega_b<\omega_c<\omega_d$) of the light propagating in the waveguide 1G is used as a parameter.

$$R=h(\phi,\omega) \qquad \text{(Equation 1)}$$

Equation 1 depends on the structure of the semiconductor optical element, and the detail of Equation 1 is thus not described. Details of the following Equations 2 and 3 are not described for the same reason.

As apparent from the graph shown in FIG. 2, when the first reflectivity $R_L$ of the first end surface $1T_L$ is set to 10%, and a spot size $\omega_d$ is selected as the spot size $\omega_L$, the angle $\phi_L$ of the optical axis of the waveguide 1G on the side of the first end surface $1T_L$ with respect to the normal to the first end surface $1T_L$ is the angle $\phi_a$.

Figure 3:
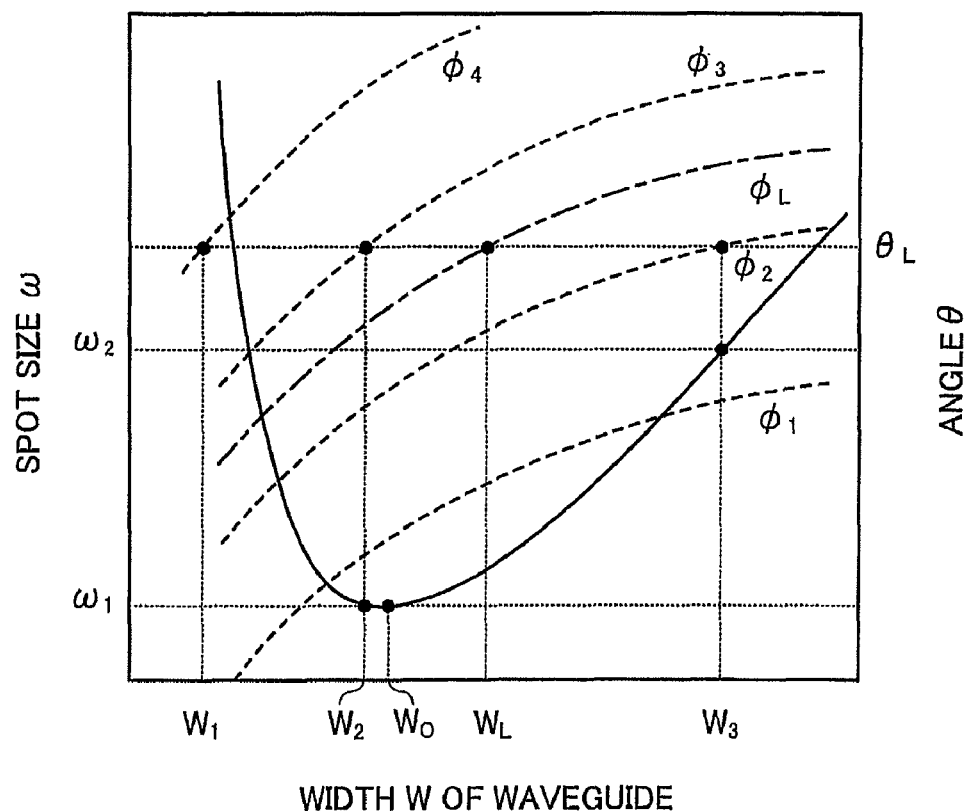
FIG. 3 is a graph showing the relationship (indicated by a solid line) between a spot size $\omega$ of light and the width W of the waveguide, the relationship (indicated by a dashed line) among the width W of the waveguide, an angle $\phi$ of the optical axis of the end portion of the waveguide in the vicinity of the end surface of the waveguide with respect to the end surface of the waveguide, and an angle $\theta$ of the direction of propagation of light to be output with respect to the end surface of the waveguide.

FIG. 3 is a graph showing the relationship (indicated by a solid line) between the spot size $\omega$ of light and the width W of the waveguide, and the relationship (indicated by a dashed line) among the width W of the waveguide, the angle $\Phi$ of the optical axis of the waveguide in the vicinity of the end surface of the waveguide with respect to the normal to the end surface of the waveguide, and the angle $\theta$ of the direction of propagation of light to be output with respect to the normal to the end surface of the waveguide. The relationship between the spot size co of light and the width W of the waveguide is expressed by Equation 2.

$$\omega = f(W) \qquad \text{(Equation 2)}$$

The relationship between the width W of the waveguide and a refractive index n in the vicinity of the end surface of the waveguide is expressed by Equation 3.

$$n = g(W) \qquad \text{(Equation 3)}$$

Among the refractive index obtained by Equation 3, the angle $\theta$ of the direction of propagation of light to be output with respect to the normal to the end surface of the waveguide, and the angle $\phi$ of the optical axis of the waveguide in the vicinity of the end surface of the waveguide with respect to the normal to the end surface of the waveguide, Snell's law is applied. Thus, Equation 4 is expressed by use of the angle ($\phi$, the angle $\theta$, and the width W of the waveguide.

$$\sin\theta = n/n_0 \sin\phi = g(W)\sin\phi$$

where $n_0$ is a refractive index of air $\approx 1$ (Equation 4)

Each of the dashed lines shown in FIG. 3 indicates the relationship (Snell's law under the condition that the angle (($\Phi$ is constant) between the width W of the waveguide and the angle $\theta$ of the direction of propagation of light to be output with respect to the normal to the end surface of the waveguide under the condition that the angle $\phi(\phi_1<\phi_2<\phi_3<\phi_4)$ constant.

The angle $\theta_L$ of the direction of propagation of light to be output from the first end surface $1T_L$ with respect to the normal to the first end surface $1T_L$ of the waveguide is determined in accordance with a specification of the semiconductor optical element and with a specification of a semiconductor module having the semiconductor optical element therein. For example, if the angle $\theta_L$ needs to be 20 degrees, Equation 5 is expressed.

$$n_L \sin\phi_L = \sin 20° = 0.342 \qquad \text{(Equation 5)}$$

The angle $\phi_L$ and the width $W_L$ of the waveguide in the first waveguide cross section $1S_L$ are determined by procedures described below, the angle $\phi_L$ being formed between the optical axis of the end portion of the waveguide in the vicinity of the end surface of the waveguide and the normal to the first end surface of the waveguide.

(1) The first reflectivity $R_L$ (e.g., 10%) and the angle $\theta_L$ (e.g., 20 degrees) are set.

(2) According to Equation 4 (dashed lines shown in FIG. 3), a candidate value ($\phi_2 \leq \phi \leq \phi_4$) of the angle $\phi_L$ that can be obtained based on the angle $\theta_L$ is tentatively set.

(3) According to Equation 4 (dashed lines shown in FIG. 3), the width W ($W_1 \leq W \leq W_3$) of the waveguide is obtained so that the angle $\theta$ is $\theta_L$ and the angle $\phi$ is equal to or smaller than $\phi_2$ and equal to or larger than $\phi_4$. The width W (e.g., $W_2 \leq W \leq W_3$) of the waveguide is preferably within a range, in which a variation in the spot size $\omega$ of light is smaller than a variation in the width W of the waveguide in the process for manufacturing the semiconductor optical element, as a candidate of the width $W_L$ of the waveguide.

(4) According to Equation 3 (solid lines shown in FIG. 2), the spot size $\omega$ ($\omega_1 \leq \omega \leq \omega_2$) is obtained for each of candidates of the width $W_L$ of the waveguide. A combination of a candidate of the angle $\omega_L$ and a candidate of the first spot size $\omega_L$ is determined.

(5) According to Equation 1 (FIG. 2), a combination of the angle $\phi_L$ and the first spot size $\omega_L$, which leads to the reflectivity $R_L$ of 10%, is selected among combinations of the candidates, to determine the width $W_L$ of the waveguide corresponding to the selected combination.

When the width $W_L$ (3.5 to 4.5 μm) of the waveguide, which leads to the fact that the refractive index of the first end surface $1T_L$ is 3.2, is selected, the angle $\phi_L$ is 6.1 degrees.

Next, the angle $\phi_H$ and the width $W_H$ of the waveguide in the second waveguide cross section $1S_H$ are determined by procedures described below, the angle $\phi_H$ being formed between the optical axis of the waveguide in the vicinity of the second end surface $1T_H$ of the waveguide and the normal to the second end surface $1T_H$ of the waveguide.

The reflectivity of the second end surface $1T_H$ of the waveguide needs to be high. As shown in FIG. 2, however, the higher the reflectivity of the second end surface $1T_H$ is, the smaller the spot size $\omega$ ($\omega_a<\omega_b<\omega_c<\omega_d$) is, under the condition that the angle $\phi$ is constant. If the second spot size $\omega_H$ of light at the second end surface $1T_H$ is set as small as possible, high reflectivity of the second end surface $1T_H$ can be obtained.

When the width $W_L$ (e.g., $W_2 \leq W \leq W_3$) of the waveguide is within a range in which the variation in the spot size co is smaller than the variation in the width W of the waveguide in the process for manufacturing the semiconductor optical element, the width $W_H$ of the waveguide at the second end surface $1T_H$ is smaller than the width $W_L$ of the waveguide at the first end surface $1T_L$.

The spot size co indicates a curved line protruding downward and is a function of the width W of the waveguide, as expressed by Equation 2 (solid line shown in FIG. 3). The spot size co shows the minimum value when the width of the waveguide is $W_0$.

When the minimum value of the spot size $\omega$ is $\omega_c$, the angle $\phi_H$ needs to be larger than the angle $\phi_a$ and smaller than the angle $\phi_b$ based on the graph shown in FIG. 2 in order to ensure the reflectivity of about 20% on the side of the second end surface $1T_H$.

When the angle $\theta_H$ of the direction of propagation of light output from the second end surface $1T_H$ with respect to the normal to the second end surface $1T_H$ of the waveguide is 20 degrees which is the same as the angle $\theta_L$ of the direction of propagation of light output from the first end surface $1T_L$ with respect to the normal to the first end surface $1T_L$ of the waveguide, the product of the sine of the angle $\phi_H$ and the refractive index n of the second end surface $1T_H$ needs to satisfy Equation 6.

$$n_H \sin\phi_H = \sin 20° = 0.342 \qquad \text{(Equation 6)}$$

Since the refractive index $n_H$ is determined as a function of the width $W_H$ of the waveguide by using Equation 2, the angle $\phi_H$ is determined.

If the refractive index $n_H$ is 3.3 when the width $W_H$ of the waveguide is 1.8 um, the angle $\phi_H$ is 6.0 degrees and the reflectivity is 20%, which makes it possible to achieve the semiconductor optical element.

Figure 4:
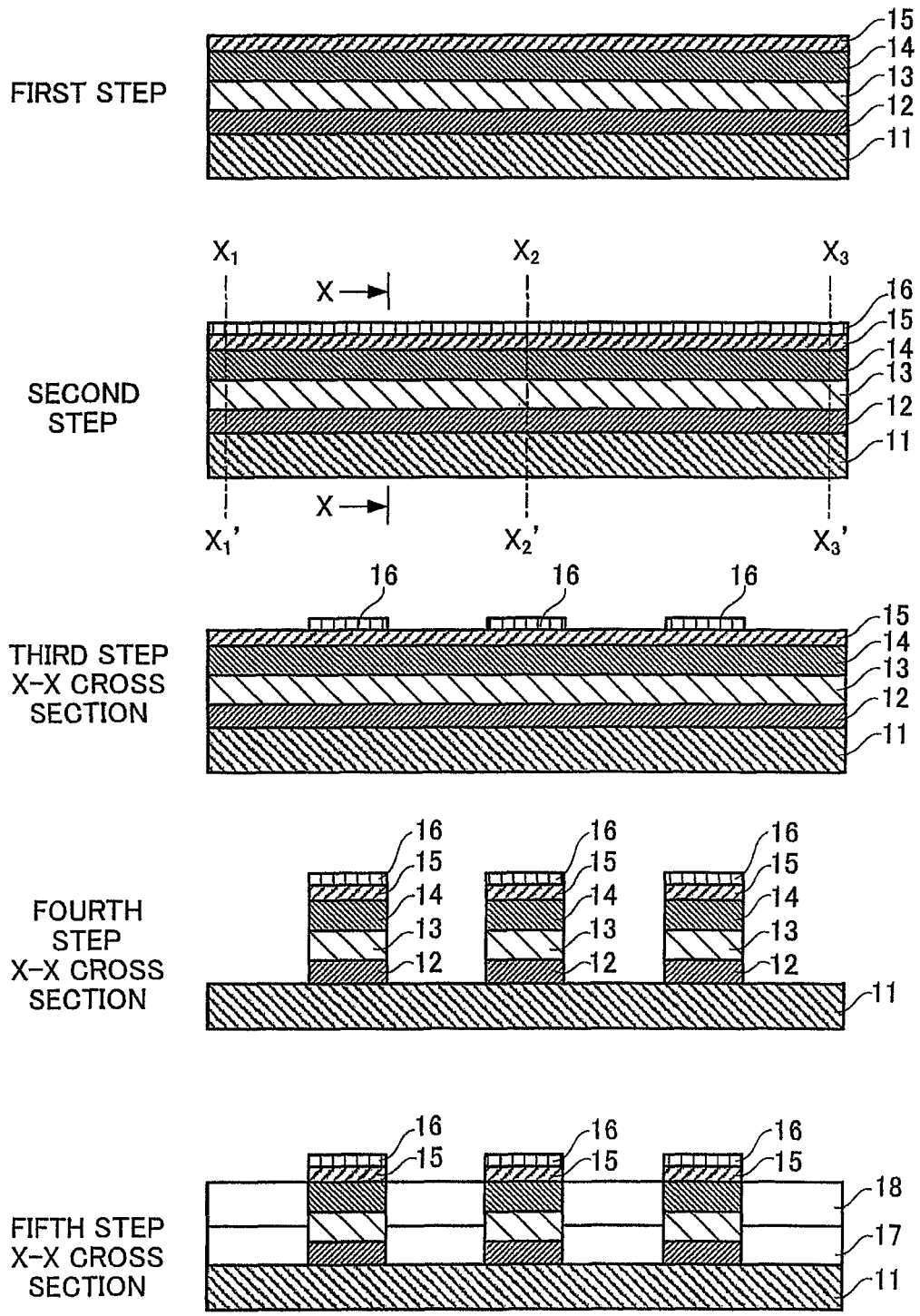
FIG. 4 is a diagram showing an example of a process of manufacturing the semiconductor optical element according to the first embodiment.
Figure 5:
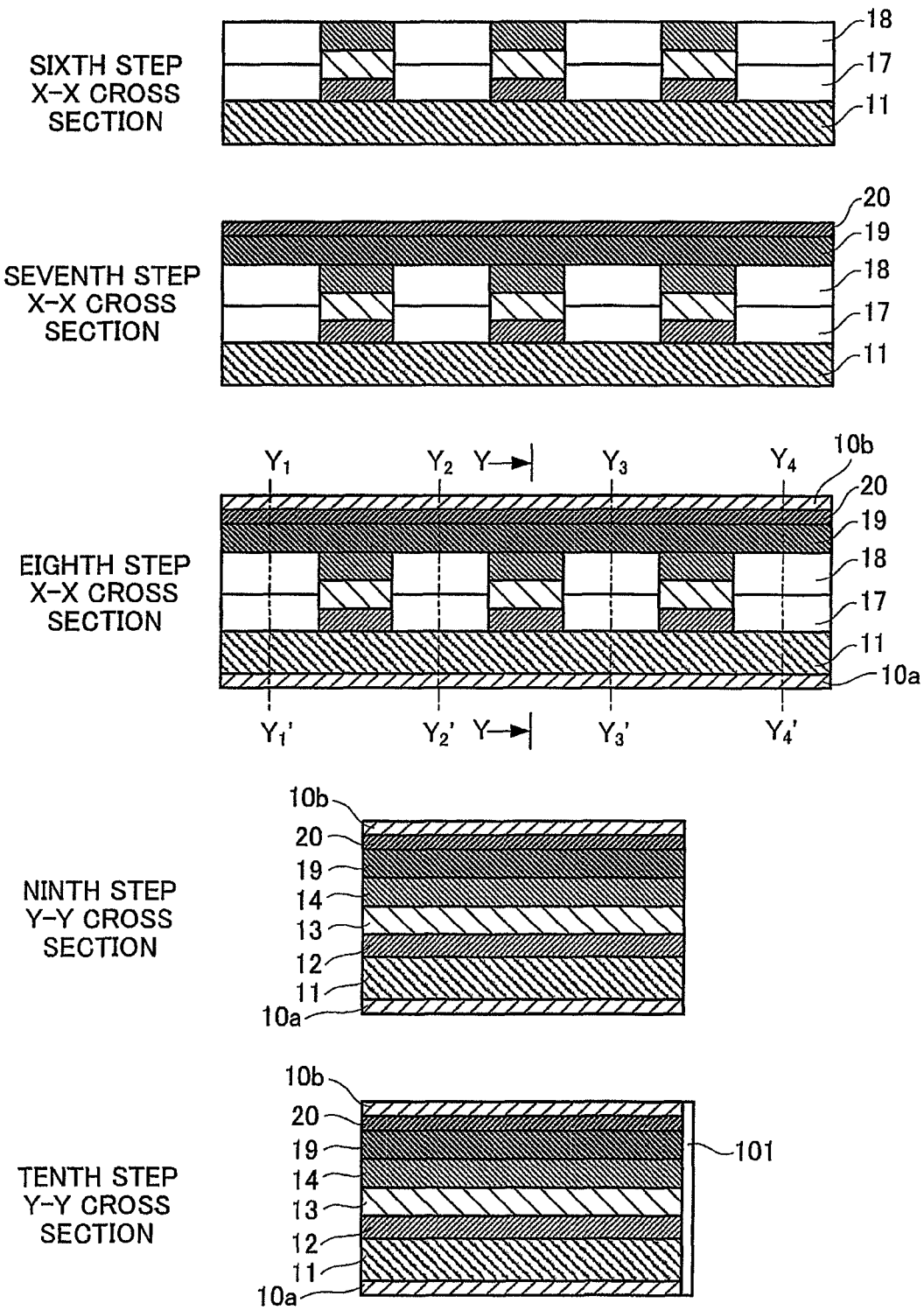
FIG. 5 is a diagram showing the example of the process of manufacturing the semiconductor optical element according to the first embodiment.

Next, the process for manufacturing the semiconductor optical element 1 will be described as an example with reference to FIGS. 4 and 5.

First step: Using a metal organic vapor phase epitaxy (MOVPE) method, an n-type InP cladding layer 12, an InGaAsP active layer 13 having a multiple quantum well structure, a first p-type InP cladding layer 14, and a p-type InGaAsP cap layer 15 are sequentially laminated on a n-type InP semiconductor substrate.

Second step: Using a chemical vapor deposition (CVD) method, an SiNx layer 16 is formed on the cap layer 15.

Third step: Using a photolithography method, a mask pattern is transferred to the SiNx layer 16.

Fourth step: Using wet etching or dry etching, a mesa structure is formed, which includes the n-type InP cladding layer 12, the active layer 13, the first p-type InP cladding layer 14, the cap layer 15, and the SiNx layer 16 used as an etching mask.

Fifth step: Using the MOVPE method, a p-type InP lower buried layer 17 and an n-type upper buried layer 18 are sequentially laminated on both sides of the mesa structure with the SiNx layer 16 used as a growth prevention mask.

Sixth step: The SiNx layer 16 is removed by using a hydrofluoric acid, and the cap layer 15 is removed by using a sulfuric acid and an aqueous hydrogen peroxide solution.

Seventh step: Using the MOVPE method, a second p-type InP cladding layer 19 and a p-type InGaAs contact layer 20 are sequentially laminated on the first p-type InP cladding layer 14 and the n-type upper buried layer 18.

Eighth step: a p-type metal electrode 10a is formed on the contact layer 20, and an n-type metal electrode 10b is formed under the semiconductor substrate 11, to complete a wafer.

Ninth step: the wafer is cut along a predetermined line ($X_1X_1'$, $X_2X_2'$, $X_3X_3'$, etc.) so that cleavage surfaces of the semiconductor optical element are parallel to each other and that multiple elements are arranged side-by-side and each of the multiple elements forms a bar.

Tenth step: An antireflection film 101 is coated on the side of a low-reflectivity end surface.

Eleventh step: The bar is cut along a predetermined line ($Y_1Y_1'$, $Y_2Y_2'$, $Y_3Y_3'$, $Y_4Y_4'$, etc.) for each of the semiconductor optical elements.

Figure 6:
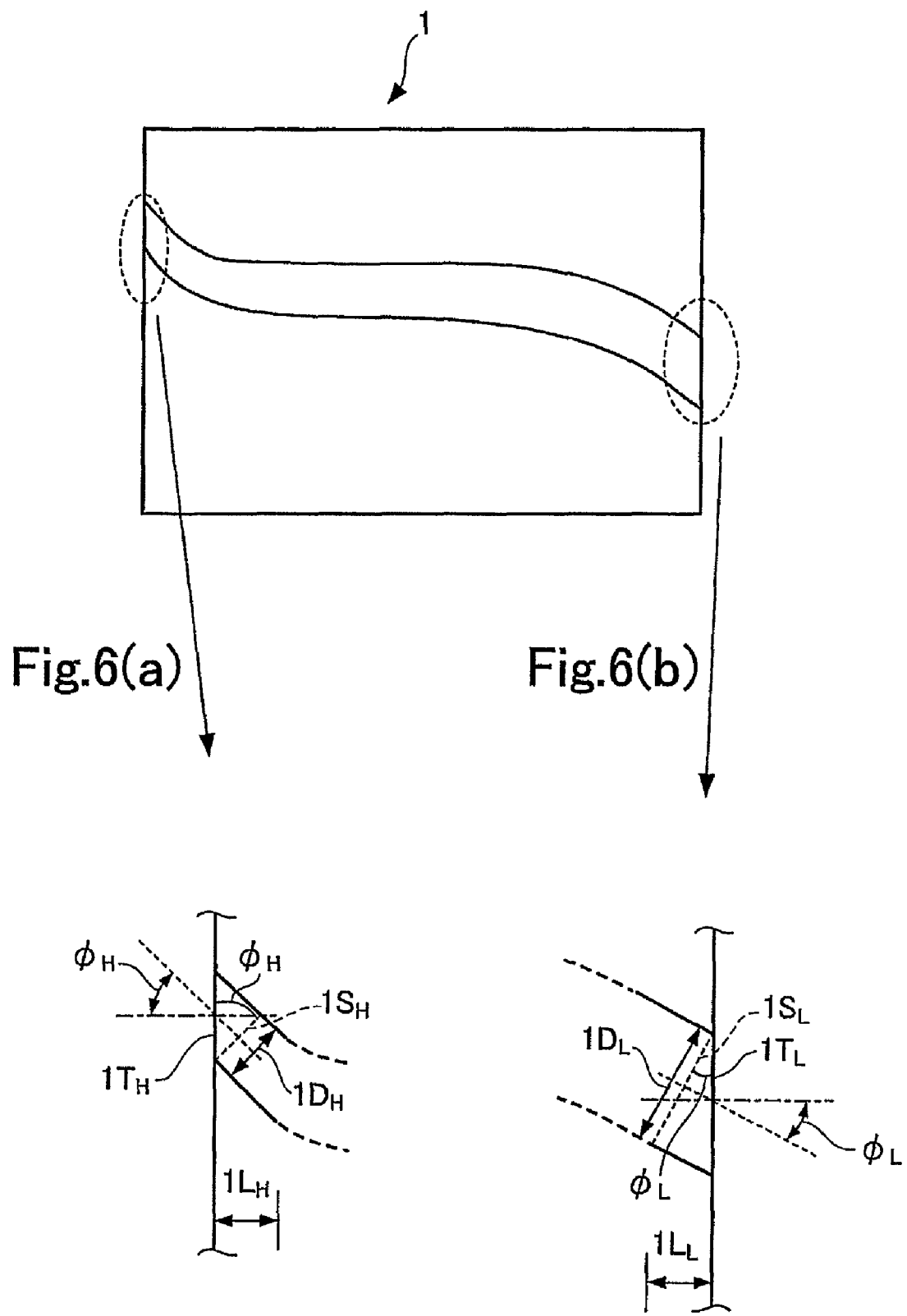
FIGS. 6(a) and 6(b) are enlarged views respectively showing the vicinity of a first end surface $1T_L$ and the vicinity of a second end surface $1T_H$ of the waveguide.

As shown in the enlarged views of FIG. 6 illustrating the first end surface $1T_L$ and the second end surface $1T_H$, the waveguide 1G preferably includes a first linear potion having a first width $1D_L$ and extending a predetermined distance from the first end surface $1T_L$ and a second linear portion having a second width $1D_H$ and extending a predetermined distance from the second end surface $1T_H$.

In the present embodiment, the width of the waveguide is gradually increased from the second linear portion to the first linear portion, and the waveguide has a connecting portion, which connects the first and second linear portions and is smoothly curved. The waveguide in the present embodiment, however, is not limited to the waveguide having the above-mentioned shape.

The waveguide 1G has the linear portions on both end sides in order to prevent a variation in the angle φ of the optical axis of the each of the linear portions with respect to the normal to each of the first and second end surfaces and a variation in the reflectivity even if either one of or both the first end surface and the second end surface is or are misaligned from a desired position(s) on either one of or both the first cleavage surface $1C_L$ and the cleavage surface $1C_H$.

Figure 7:
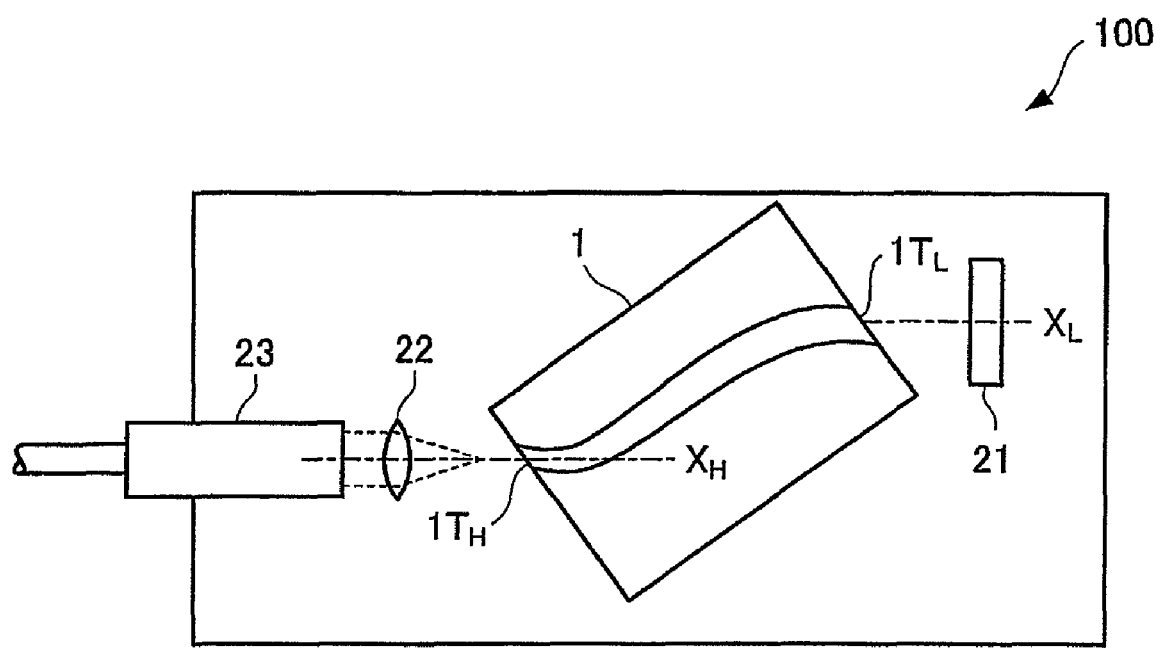
FIG. 7 is a top view of an external cavity laser using the semiconductor optical element according to the first embodiment.

FIG. 7 is a top view of an external cavity laser 100 using the semiconductor optical element 1 according to the first embodiment. The external cavity laser 100 includes a reflecting mirror 21 (e.g., a liquid crystal tunable mirror) having wavelength selectivity, which is arranged on the direction of propagation of light output from the first end surface $1T_L$ of the waveguide 1G. The external cavity laser 100 also includes a collimate lens 22 and an optical fiber connection terminal 23, which are arranged on the direction of propagation of light output from the second end surface $1T_H$ of the waveguide 1G.

The optical axis $X_L$ passing through the reflecting mirror 21 can be parallel to the optical axis $L_H$ passing through the collimate lens 22 and the optical fiber connection terminal 23, since the angle $\theta_L$ of the direction of propagation of light output from the first end surface $1T_L$ with respect to the first end surface $1T_L$ of the waveguide 1G is an angle θ, which is the same as the angle $\theta_H$ of the direction of propagation of light output from the second end surface $1T_H$ with respect to the second end surface $1T_H$ of the waveguide 1G.

The external cavity laser 100 using the semiconductor optical element 1 according to the first embodiment functions as an EC-LD. Light generated in the semiconductor optical element 1 passes through the first end surface $1T_L$ having low reflectivity, is reflected by the reflecting mirror 21 having wavelength selectivity, and returns to the semiconductor optical element 1. Part of the light returned to the semiconductor optical element 1 is reflected by the second end surface $1T_H$ having high reflectivity, while the other part of the light is output from the second end surface $1T_H$ to an optical fiber through the collimate lens 22 and the optical fiber connection terminal 23.

As described above, the waveguide of the semiconductor optical element according to the first embodiment has a low-reflectivity end surface and a high-reflectivity end surface. The angle of the direction of propagation of light output from the low-reflectivity end surface of the waveguide with respect to the low-reflectivity end surface of the waveguide is the same as the angle of the direction of propagation light output from the high-reflectivity end surface of the waveguide with respect to the high-reflectivity of the waveguide even if the optical axis of the waveguide in the vicinity of one of the end surfaces of the waveguide is not perpendicular to the one of the end surfaces of the waveguide.

In the present embodiment, the directions of propagation of light output from both end surfaces of the waveguide are parallel to each other. The structure of the waveguide, however, is not limited to the above. The semiconductor optical element allows light output from each end surface to propagate in a desired direction to meet a specification of a semiconductor module having the semiconductor optical element therein.

Second Embodiment

The external cavity laser using the semiconductor optical element will be described, which is an optical device.

Figure 8:
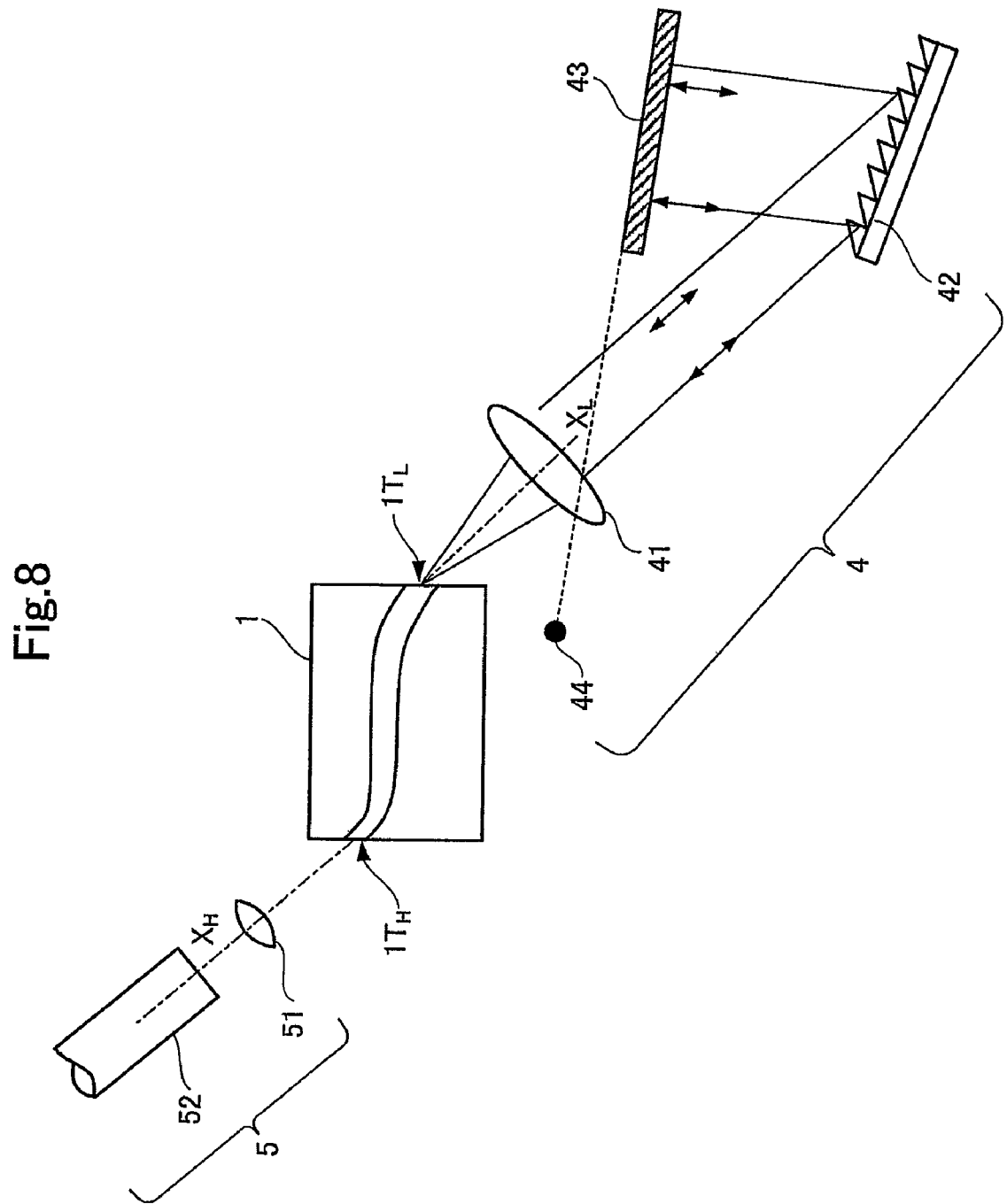
FIG. 8 is a block diagram showing an external cavity laser that employs a Littman design.

As shown in FIG. 8, the external cavity laser according to the present invention is provided with the semiconductor optical element 1 according to the first embodiment, light feedback means 4 for causing light having a specified wavelength output from the first end surface $1T_L$ of the waveguide 1G to selectively return to the first end surface $1T_L$; and light output means 5 for outputting light having a specified wavelength from the second end surface $1T_H$ of the waveguide 1G.

The light feedback means 4 includes a collimate lens 41, a diffraction grating 42, a recursive reflecting mirror 43, and an actuator (not shown). The light output means 5 includes a collimate lens 51 and an optical fiber 52.

FIG. 8 is a block diagram showing the external cavity laser that employs a Littman design.

In the external cavity laser, part of light reached to the second end surface $1T_H$ of the waveguide 1G is reflected by the second end surface $1T_H$ having high reflectivity, while the other part of the light is output from the second end surface $1T_H$ to the optical fiber 52 through the collimate lens 51.

The light output from the first end surface $1T_L$ of the waveguide 1G is collimated by the collimate lens 41 and diffracted by the diffraction grating 42. The diffracted light is reflected by the recursive reflecting mirror 43 and returns to the semiconductor optical element 1 through the diffraction grating 42.

The recursive reflecting mirror 43 is rotatable about a rotation center 44 thereof by use of an actuator (not shown). The recursive reflecting mirror 43 rotates to change a distance between the diffraction grating 42 and the recursive reflecting mirror 43 and an angle formed between the diffraction grating 42 and the recursive reflecting mirror 43 and to thereby control the wavelength of the output light.

Figure 9:
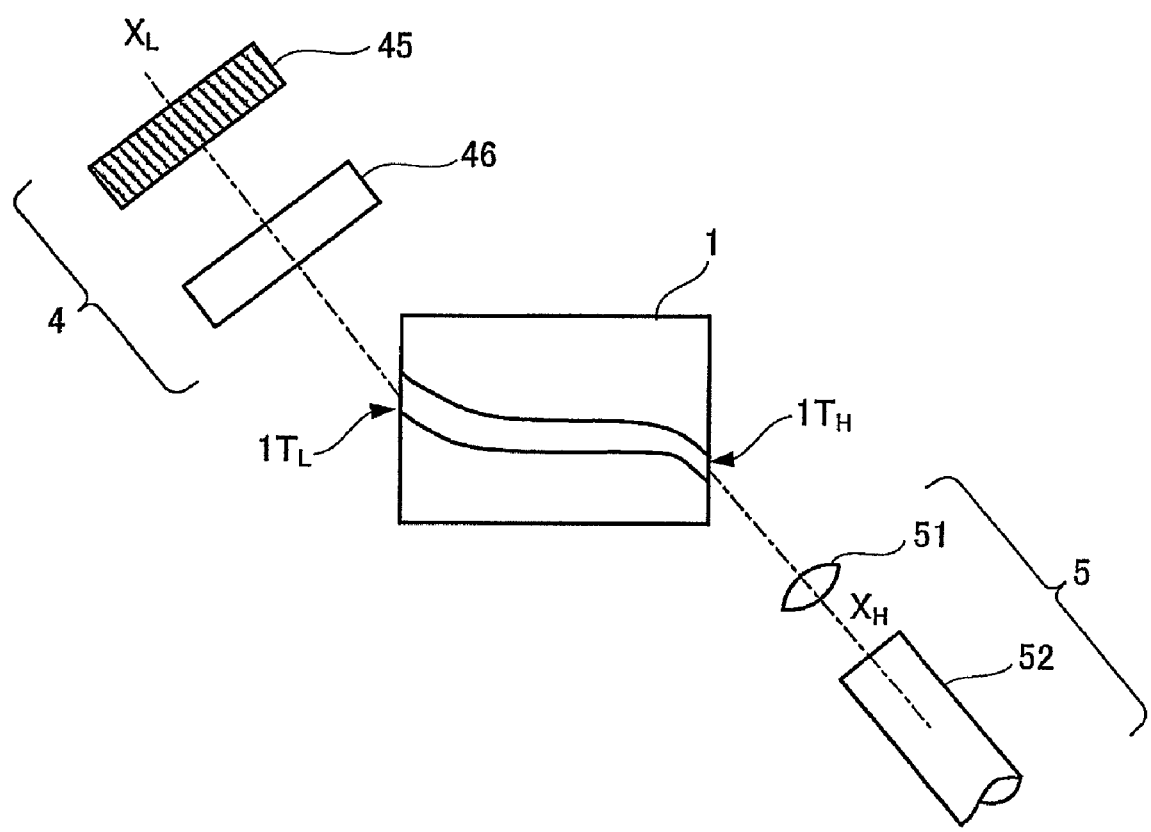
FIG. 9 is a block diagram showing an external cavity laser using an etalon.

FIG. 9 is a block diagram showing the external cavity laser using an etalon. The light feedback means 4 shown in FIG. 9 has a liquid crystal tunable mirror 45 and an etalon 46.

The light output from the first low-reflectivity end surface $1T_L$ of the waveguide 1G passes through the etalon 46 arranged between the liquid crystal tunable mirror 45 and the semiconductor optical element 1. The light is then reflected by the liquid crystal tunable mirror 45 and returns to the semiconductor optical element 1.

Since the wavelength of the light reflected by the liquid crystal tunable mirror 45 varies based on a voltage applied to the liquid crystal tunable mirror 45, the liquid crystal tunable mirror 45 can control the wavelength of the light. The etalon 46 may have fixed optical characteristics.

The liquid crystal mirror 45 may be replaced with a total reflection mirror and a tunable band pass filter. In this case, the band of wavelengths of light to be passed by the tunable band pass filter can be changed to adjust the wavelength of the output light.

Figure 10:
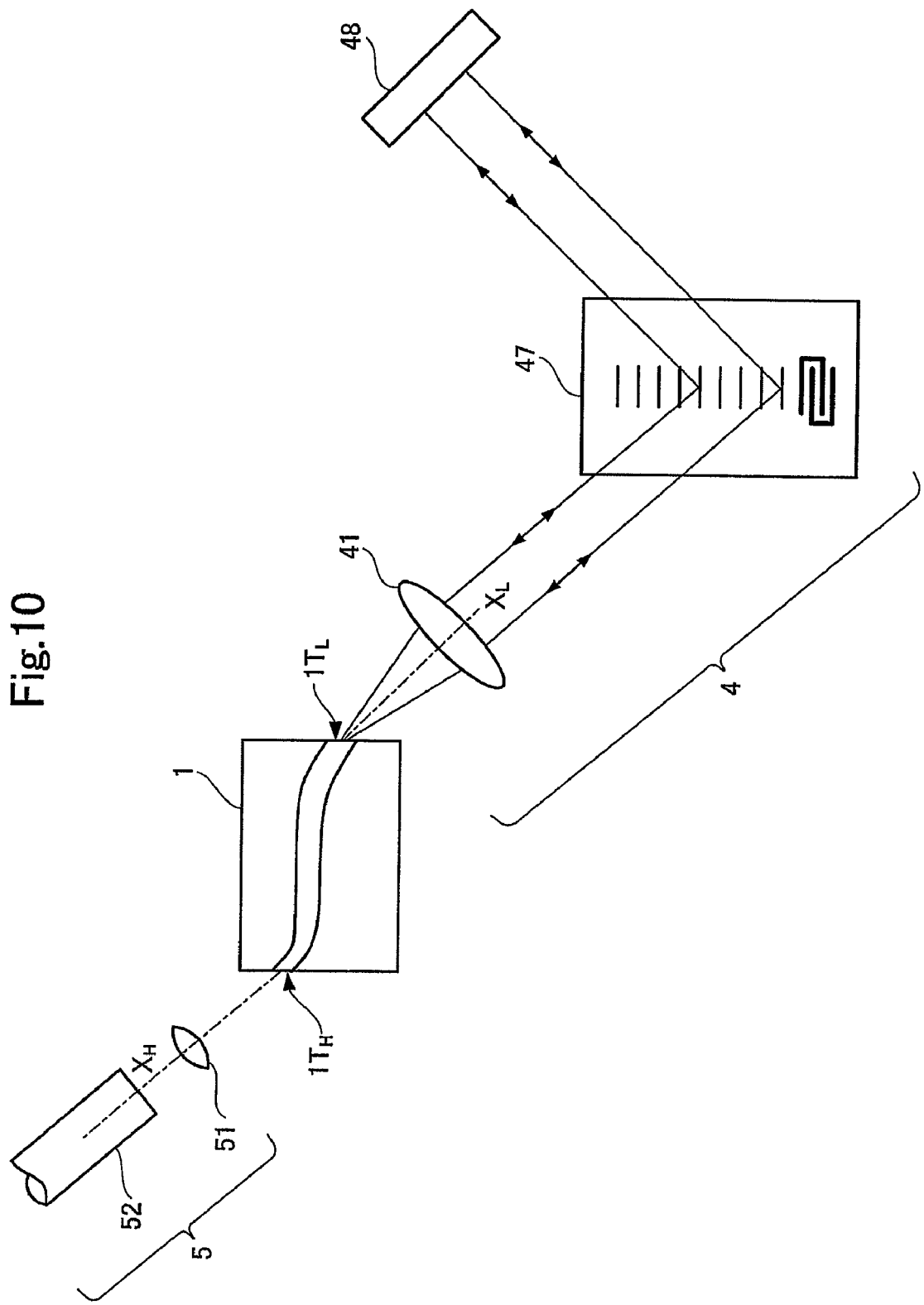
FIG. 10 is a block diagram showing an external cavity laser using an acousto-optical modulator (AOM).

FIG. 10 is a block diagram showing the external cavity laser using an acousto-optical modulator (AOM). The light feedback means 4 shown in FIG. 10 has a total reflection mirror 48, the collimate lens 41 and the AOM 47.

The light output from the first low-reflectivity end surface $1T_L$ of the waveguide 1G is collimated by the collimate lens 41 and enters the AOM 47 which has a piezoelectric transducer element. When an ultrasonic wave is applied to the piezoelectric transducer element, a refractive index of the AOM 47 periodically varies, which substantially forms a diffraction grating.

The AOM 47 diffracts the light collimated by the collimate lens 41. The diffracted light is reflected by the total reflection mirror 48 and returns to the semiconductor optical element 1 through the AOM 47 and the collimate lens 41.

The frequency of the ultrasonic wave can be changed to change the grating interval of the diffraction grating and to thereby control the wavelength of the output light.

Figure 11:
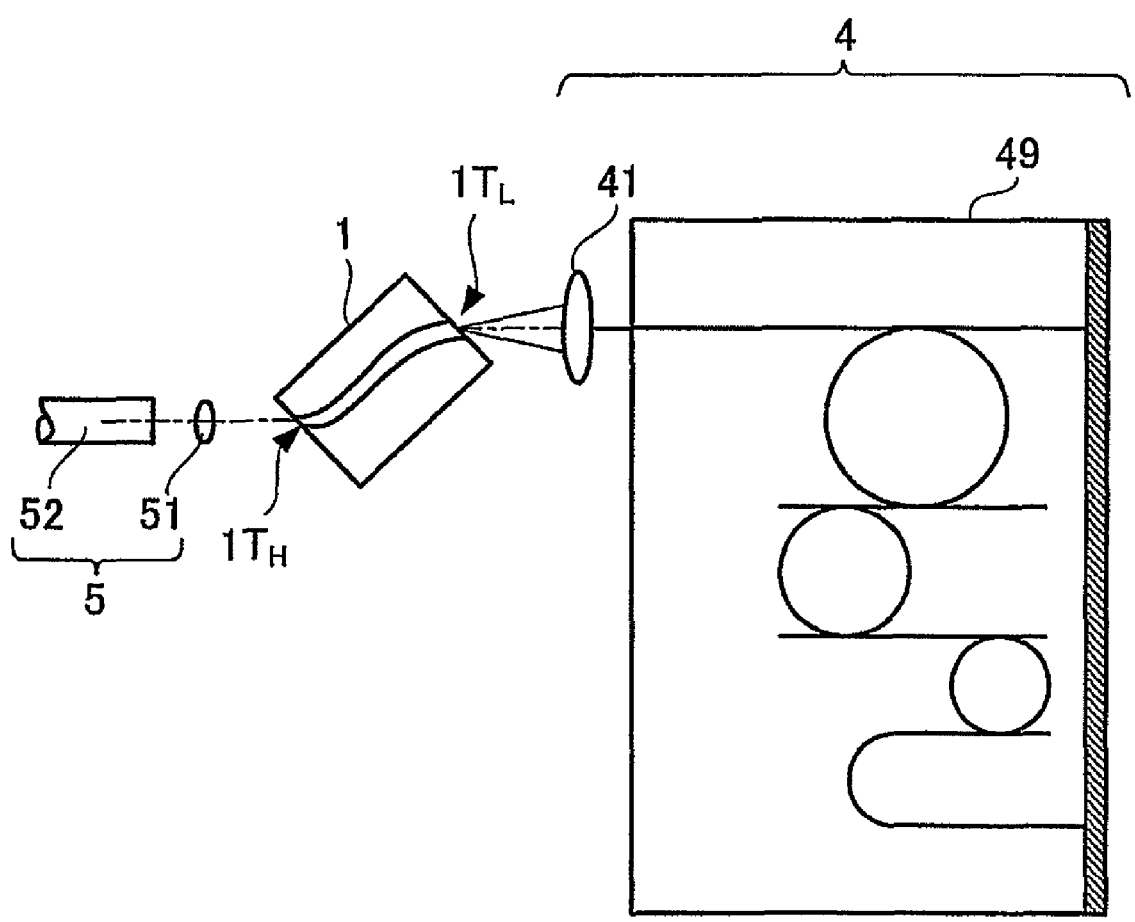
FIG. 11 is a block diagram showing an external cavity laser using a ring resonator.

FIG. 11 is a top view of the external cavity laser using a ring resonator. The light feedback means 4 shown in FIG. 11 has a tunable ring resonator filter 49 and the collimate lens 41.

The light output from the first low-reflectivity end surface $1T_L$ of the waveguide 1G is input to the tunable ring resonator filter 49 through the collimate lens 41. The tunable ring resonator filter 49 is composed of a planar lightwave circuit formed on a glass substrate.

The tunable ring resonator filter 49 includes, for example, three ring resonators connected with each other by a waveguide. Each of the ring resonators can be heated by a heater (not shown). The amount of heat applied to the ring resonators is changed to control the refractive index of the waveguide connecting the ring resonators and to thereby control the wavelength of oscillation light. Thus, the tunable ring resonator filter 49 can control the wavelength of the output light.

Figure 12:
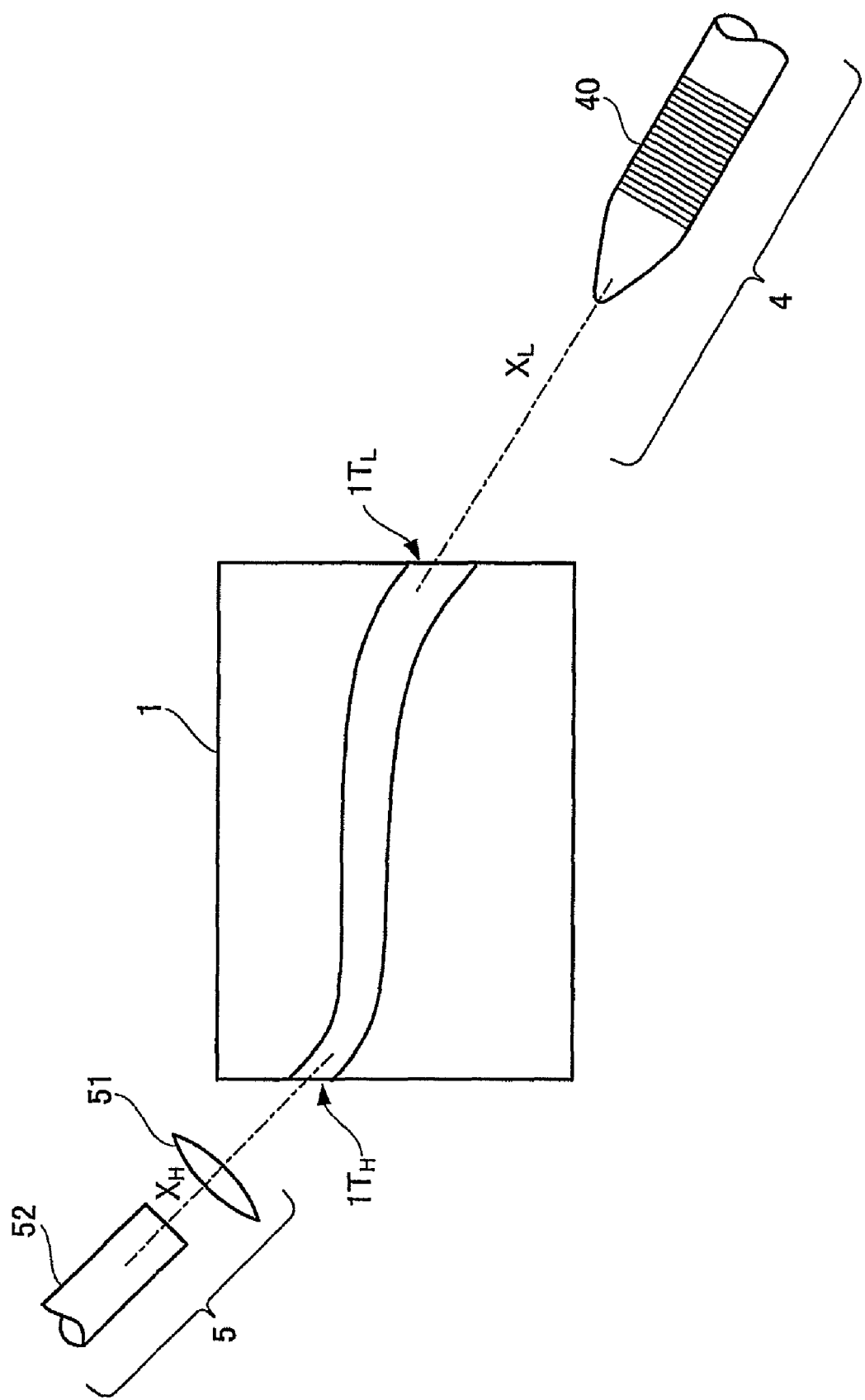
FIG. 12 is a block diagram showing an external cavity laser using an FBG.
Figure 13A:
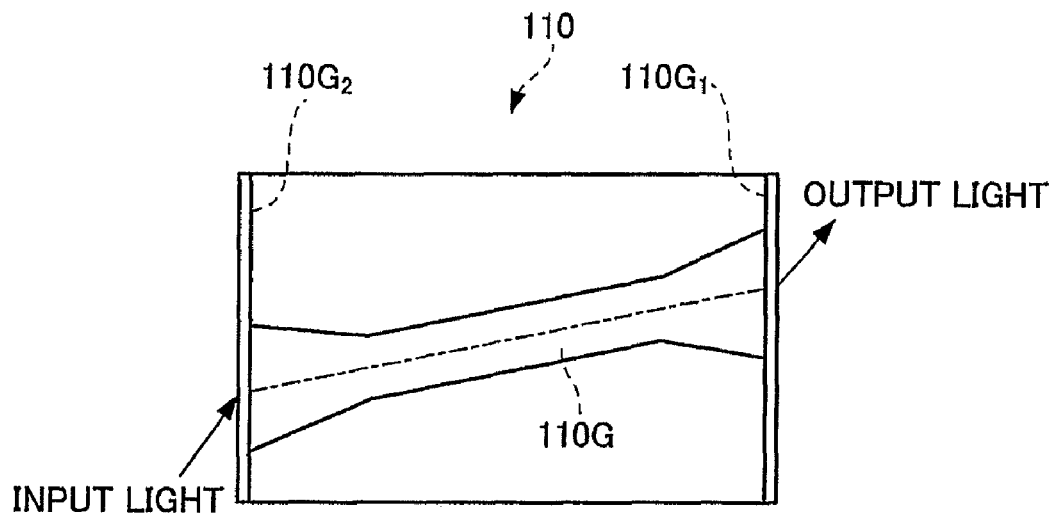
FIG. 13(a) is a top view of a conventional semiconductor optical element.
Figure 13B:
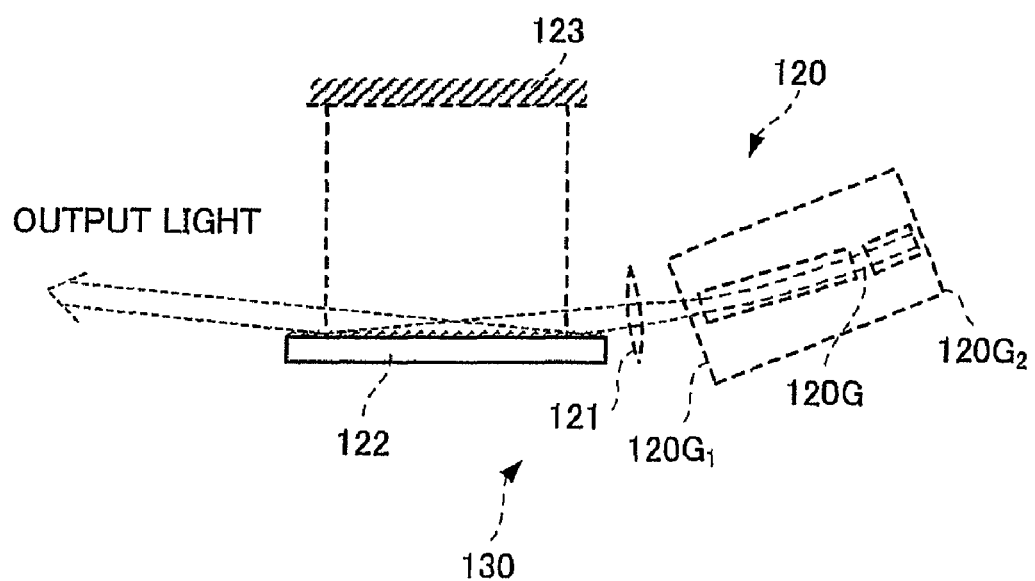
FIG. 13(b) is a top view of a conventional optical device having a semiconductor optical element.

FIG. 12 is a block diagram showing the external cavity laser using a fiber Bragg grating (FBG) 40. The light feedback means 4 shown in FIG. 12 includes the FBG 40 having a tip with a lens shape.

The external cavity laser shown in FIG. 12 is used as an optical source for exciting a Raman amplifier. The FBG 40 may be mechanically extensible to vary the wavelength of light that oscillates.

INDUSTRIAL APPLICABILITY

As described above, the semiconductor optical element according to the present invention has one end surface with low reflectivity and another end surface with certain reflectivity, each of the end surfaces forming an angle other than a right angle with respect to the optical axis of a corresponding one of the linear portions of the waveguide in the vicinity of the end surfaces, and can be therefore applied to an EC-LD and SLD and useful as an optical device and the like.

What is claimed is:

1. A semiconductor optical element for an external cavity laser having a pair of cleavage surfaces, comprising:
   a semiconductor substrate having a base surface; and
   a planer structure provided on said base surface, and provided with a waveguide having an active layer, wherein said waveguide has first and second end surfaces defined by said respective cleavage surfaces,
   said first end surface of said waveguide has first reflectivity, and said second end surface of said waveguide has second reflectivity,
   said waveguide includes one end portion having an optical axis being at a first angle to a normal to said first end surface, and one end portion having an optical axis being at a second angle to a normal to said second end surface,
   said waveguide guides light so that said light is output from said first end surface in a first direction, and that said light is output from said second end surface in a second direction parallel to said first direction, and
   said light guided by said waveguide in the vicinity of said first end surface has a first spot size measured in a lateral direction of said waveguide, and said light guided by said waveguide in the vicinity of said second end surface has a second spot size measured in said lateral direction of said waveguide, said first spot size being different from said second spot size to make said first reflectivity be different from said second reflectivity.

2. A semiconductor optical element for an external cavity laser having a pair of cleavage surfaces parallel to each other, comprising:
   a semiconductor substrate having a base surface; and
   a planer structure provided on said base surface, and provided with a waveguide having an active layer, wherein said waveguide has first and second end surfaces defined by said respective cleavage surfaces,
   said waveguide includes one end portion having an optical axis being at a first angle to a normal to said first end surface, and one end portion having an optical axis being at a second angle to a normal to said second end surface, said first angle being not equal to zero, said second angle being not equal to zero and different from said first angle, said waveguide guides light so that said light is output from said first end surface in a first direction, and that said light is output from said second end surface in a second direction parallel to said first direction, and said light guided by said waveguide in the vicinity of said first end surface has a first spot size measured in a lateral direction of said waveguide, and said light guided by said waveguide in the vicinity of said second end surface has a second spot size measured in said lateral direction of said waveguide, said first spot size being different from said second spot size to make reflectivity of said first end surface be different from reflectivity of said second end surface.

3. A semiconductor optical element for an external cavity laser having a pair of cleavage surfaces parallel to each other, comprising:

a semiconductor substrate having a base surface; and a planer structure provided on said base surface, and provided with a waveguide having an active layer, wherein said waveguide has first and second end surfaces defined by said respective cleavage surfaces, said waveguide includes one end portion having an optical axis being at a first angle to a normal to said first end surface, and one end portion having an optical axis being at a second angle to a normal to said second end surface, said first angle being not equal to zero, said second angle being not equal to zero and different from said first angle, said waveguide guides light so that said light in the vicinity of said first end surface has a first spot size measured in a lateral direction of said waveguide, and said light in the vicinity of said second end surface has a second spot size measured in said lateral direction of said waveguide, said first spot size being different from said second spot size to make reflectivity of said first end surface be different from reflectivity of said second end surface.

4. A semiconductor optical element for an external cavity laser as set forth in any one of claims 1 to 3, wherein said waveguide has a first width at said first end surface and a second width at said second end surface, said first width being larger than said second width.

5. A semiconductor optical element for an external cavity laser as set forth in any one of claims 1 to 3, wherein said waveguide has a first linear portion extending a predetermined distance from said first end surface and a second linear portion extending a predetermined distance from said second end surface.

6. An external cavity laser comprising:

a semiconductor optical element as set forth in any one of claims 1 to 3; and light feedback means for causing light having a specified wavelength to selectively return to said first end surface among light output from said first end surface of said waveguide, wherein said light having said specified wavelength is output from said second end surface of said waveguide.

\* \* \* \* \*